United States Patent
Butler et al.

(10) Patent No.: US 10,321,569 B1
(45) Date of Patent: Jun. 11, 2019

(54) ELECTRONIC MODULE AND METHOD OF MAKING SAME

(71) Applicant: VPT, Inc., Blacksburg, VA (US)

(72) Inventors: Stephen J. Butler, Warrenton, VA (US); Anthony G. Salamone, Blacksburg, VA (US)

(73) Assignee: VPT, INC., Blacksburg, VA (US)

( * ) Notice: Subject to any disclaimer, the term of this patent is extended or adjusted under 35 U.S.C. 154(b) by 155 days.

(21) Appl. No.: 15/136,463

(22) Filed: Apr. 22, 2016

Related U.S. Application Data

(60) Provisional application No. 62/154,186, filed on Apr. 29, 2015.

(51) Int. Cl.
*H05K 1/00* (2006.01)
*H05K 1/18* (2006.01)
*H05K 7/00* (2006.01)
*H05K 1/11* (2006.01)
*H05K 3/36* (2006.01)
*H05K 9/00* (2006.01)

(52) U.S. Cl.
CPC ............... *H05K 1/18* (2013.01); *H05K 1/115* (2013.01); *H05K 3/368* (2013.01); *H05K 9/0007* (2013.01)

(58) Field of Classification Search
CPC .......... H02M 3/00; H02M 3/28; H05K 1/141; H05K 1/165; H05K 2201/10234; H05K 2201/10257; H05K 2201/10666; H05K 2203/041; H05K 2203/0455; H05K 3/284; H05K 3/3436; H05K 5/0247; H05K 7/209
See application file for complete search history.

(56) References Cited

U.S. PATENT DOCUMENTS

| 4,628,412 A | 12/1986 | Nigorikawa |
| 4,965,710 A * | 10/1990 | Pelly ............... H01L 25/162 257/713 |
| 5,006,667 A | 4/1991 | Lonka |
| 5,101,322 A * | 3/1992 | Ghaem ............ H05K 7/20854 333/185 |

(Continued)

FOREIGN PATENT DOCUMENTS

WO   WO 2005/057999 A1   6/2005

*Primary Examiner* — Yuriy Semenenko
(74) *Attorney, Agent, or Firm* — Daniel A. Blasiole; Charles S. Sara; DeWitt LLP

(57) ABSTRACT

Electronic module with all-sided electromagnetic interference (EMI) shielding and methods of making same. The electronic module includes an encapsulated circuit board between a top plate and a conductive bottom plate, electrical leads extending from the circuit board through the bottom plate, and a continuous conductive coating substantially covering the entire electronic module except for a bottom surface of the bottom plate. The conductive coating forms direct, independent connections at least to the circuit board and the bottom plate. The conductive coating provides EMI shielding across the top and sides of the electronic module. The conductive bottom plate provides EMI shielding across the bottom of the electronic module. Methods of manufacturing include encapsulating a circuit board between a top plate and bottom plate, separating materials from the encapsulated circuit board to expose conductive traces on the circuit board and bottom plate, and coating the sawed device with a conductive coating.

10 Claims, 9 Drawing Sheets

(56) References Cited

U.S. PATENT DOCUMENTS

| | | | |
|---|---|---|---|
| 5,375,040 A * | 12/1994 | Cooper | H05K 7/142 |
| | | | 361/730 |
| 5,689,878 A | 11/1997 | Dahringer et al. | |
| 5,778,526 A | 7/1998 | Vinciarelli et al. | |
| 5,872,332 A | 2/1999 | Verma | |
| 5,885,850 A | 3/1999 | Val | |
| 6,005,773 A * | 12/1999 | Rozman | H02M 3/00 |
| | | | 361/707 |
| 6,049,469 A * | 4/2000 | Hood, III | G06F 1/182 |
| | | | 174/388 |
| 6,316,737 B1 | 11/2001 | Evans et al. | |
| 6,549,409 B1 | 4/2003 | Saxelby, Jr. et al. | |
| 6,643,135 B2 * | 11/2003 | Tomioka | H05K 1/141 |
| | | | 361/719 |
| 6,716,672 B2 | 4/2004 | Val | |
| 6,761,934 B2 | 7/2004 | Heimann et al. | |
| 6,867,746 B2 | 3/2005 | Mendolia et al. | |
| 6,958,535 B2 * | 10/2005 | Hirano | H01L 23/3737 |
| | | | 257/668 |
| 7,061,775 B2 | 6/2006 | Beihoff et al. | |
| 7,375,974 B2 * | 5/2008 | Kirigaya | H05K 1/0203 |
| | | | 174/520 |
| 7,663,065 B2 | 2/2010 | Chen et al. | |
| 8,359,739 B2 | 1/2013 | Carey et al. | |
| 2003/0013231 A1 | 1/2003 | Val | |
| 2003/0173673 A1 | 9/2003 | Val | |
| 2006/0266547 A1 * | 11/2006 | Koga | H01L 21/561 |
| | | | 174/255 |
| 2012/0140423 A1 | 6/2012 | Fisher, Jr. et al. | |
| 2012/0275105 A1 | 11/2012 | McGuire, Jr. | |
| 2012/0275286 A1 | 11/2012 | McGuire, Jr. | |
| 2012/0287582 A1 * | 11/2012 | Vinciarelli | H01R 43/24 |
| | | | 361/728 |
| 2016/0073490 A1 * | 3/2016 | Branchevsky | H01L 23/06 |
| | | | 361/783 |

* cited by examiner

ELECTRONIC MODULE AND METHOD OF MAKING SAME

FIELD OF THE INVENTION

The present invention is directed to electronic modules containing encapsulated electronic circuit assemblies, particularly electronic modules with integral electromagnetic interference shielding.

BACKGROUND

Electronic circuit assemblies, such as direct current-direct current (DC-DC) converters and others, are often encapsulated and packaged as a single module for use in a variety of end applications. Encapsulation is desired to protect the circuit assembly from damage and degradation due to handling, soldering, and cleaning during manufacturing. Encapsulation also protects the circuit assembly from environmental conditions such as mechanical shock, vibration, exposure to moisture, and chemicals in end applications, which could be anything from consumer electronics to industrial systems or avionics. Encapsulation can also provide heat distribution and cooling for internal components by providing a thermal path to an external heat sink.

Some circuit assemblies may also require electromagnetic interference (EMI) shielding to reduce their electromagnetic emissions or susceptibility to external EMI.

Some conventional encapsulated circuit assemblies employ a pre-formed, non-integral conductive housing that surrounds the circuit assembly and is filled with an encapsulating (potting) compound. Some of these housings are in the form of a five-sided, "bathtub" configuration with an open side that leaves the encapsulant exposed. Others use a bathtub configuration in combination with a base plate to cover the open side. See U.S. Pat. No. 6,005,773 to Rozman. These types of encapsulated assemblies provide encapsulation, thermal path for heat dissipating components, and some EMI shielding. However, they suffer from increased size with respect to the main circuit board, limited EMI shielding, and susceptibility to liquid cleaning. The housing increases the size of the module, due both to the thickness of the walls and to the space required between the walls and the internal circuit board. The bathtub-configured housing provides EMI shielding only on five sides.

Other approaches encapsulate the circuit assembly and then cut the encapsulated assembly to size by sawing. Electrical leads are then connected to portions of the circuit assembly exposed during the sawing. See U.S. Patent Publication 2012/0287582 to Vinciarelli. This approach eliminates the housing, which has the potential for reducing the size of the module. However, the addition of external leads increases the overall dimensions of the module. In addition, this approach does not provide EMI shielding, and exposed edges of the circuit board remain susceptible to penetration by moisture or other contaminants.

Yet other approaches overlay circuit components mounted on a top side of a laminate substrate with an overmold body and an EMI shield coating. See U.S. Pat. No. 8,359,739 to Carey. However, these approaches do not permit use of circuit assemblies with electrical components on both sides of a printed circuit board.

Encapsulated electronic circuit assemblies that provide EMI shielding and address the drawbacks outlined above are needed.

SUMMARY OF THE INVENTION

The present invention provides electronic modules containing encapsulated electronic circuit assemblies with integral EMI shielding provided over the entirety of the modules.

An exemplary electronic module comprises a top plate; a conductive bottom plate; a circuit board disposed between the top plate and the bottom plate; an encapsulant disposed between the top plate and the circuit board and between the bottom plate and the circuit board; an electrical lead in electrical connection with the circuit board and extending from the circuit board through the encapsulant and further through the bottom plate; and a continuous conductive coating surrounding the top plate, the circuit board, the encapsulant, and at least a portion of the bottom plate. The conductive coating is in electrical connection with the circuit board and the bottom plate.

The electrical connection of the conductive coating with the circuit board may be independent of the electrical connection of the conductive coating with the bottom plate and any electrical connection of the conductive coating with the electrical lead. The conductive coating may be in direct electrical connection with the circuit board via a conductive trace of the circuit board.

The electrical connection of the conductive coating with the bottom plate may be independent of the electrical connection of the conductive coating with the circuit board and any electrical connection of the conductive coating with the electrical lead. The conductive coating may be in direct electrical connection with the bottom plate via a metalized portion of the bottom plate.

The encapsulant disposed between the top plate and the circuit board and between the bottom plate and the circuit board is preferably a single, solid piece of encapsulant.

The circuit board may comprise a substrate comprising a top side and a bottom side, wherein the top side of the substrate is disposed between the bottom side of the circuit board and the top plate and the bottom side of the substrate is disposed between the top side of the circuit board and the bottom plate. The circuit board may comprise at least one electrical component spanning the substrate from beyond the top side of the substrate to beyond the bottom side of the substrate. The at least one electrical component spanning the substrate from beyond the top side of the substrate to beyond the bottom side of the substrate may comprise a component other than an electrical lead. Additionally or alternatively, the circuit board may comprise at least one electrical component on the top side of the substrate and/or at least one electrical component on the bottom side of the substrate, such as at least one electrical component disposed only on the top side of the substrate and/or at least one electrical component disposed only on the bottom side of the substrate.

The bottom plate may comprise both a conductive portion and a non-conductive portion. The conductive portion of the bottom plate may be in electrical connection with the conductive coating.

In some versions of the bottom plate, the conductive portion may comprise metal disposed on a top side of the non-conductive portion and metal disposed on a bottom side of the non-conductive portion, wherein the top side of the non-conductive portion is disposed between the bottom side of the non-conductive portion and the circuit board, and the bottom side faces a direction opposite the circuit board. The conductive portion may comprise a conductive via spanning from the metal disposed on the top side of the non-conductive portion and the metal disposed on the bottom side of the non-conductive portion. At least about 90% of the bottom side of the bottom plate preferably remains uncovered by the conductive coating.

In some versions of the bottom plate, the conductive portion comprises metal disposed between an upper non-conductive portion of the non-conductive portion and a lower non-conductive portion of the non-conductive portion, wherein the upper non-conductive portion is disposed between the lower non-conductive portion and the circuit board.

The top plate may comprise a conductive portion and a non-conductive portion. The conductive coating may be in electrical connection with the conductive portion.

The top plate, the circuit board, and the bottom plate may each extend in substantially equal lengths and widths along three separate, substantially parallel planes.

The conductive coating may comprise a polymerized coating. The conductive coating may be in direct contact with at least a portion of each of the top plate, the encapsulant, the circuit board, and the bottom plate.

The module may further comprise a continuous non-conductive coating covering the conductive coating.

The invention also provides methods of making an electronic module.

An exemplary method of the invention comprises a step of stacking a mold frame comprising an outer stack frame and an inner cavity between a top plate and a conductive bottom plate with a circuit board disposed within the inner cavity between the top plate and the bottom plate and with an electrical lead in electrical connection with the circuit board extending from the circuit board through the bottom plate, thereby forming a molding stack. The stacking may further comprise compressing the molding stack between stiffener plates. Another step includes introducing an encapsulant in the inner cavity to dispose the encapsulant between the top plate and the circuit board, between the bottom plate and the circuit board, and between the outer stack frame and the circuit board to form an encapsulated slice. Another step includes separating a portion of the encapsulated slice comprising the circuit board from a remaining portion of the encapsulated slice comprising the mold frame to expose a previously unexposed portion of the top plate, a previously encapsulated portion of the circuit board, and a previously unexposed portion of the bottom plate. Another step includes coating the separated portion of the encapsulated slice with a continuous conductive coating to surround the top plate, the circuit board, the encapsulant, and at least a portion of the bottom plate in the separated portion of the encapsulated slice to result in the conductive coating being in electrical connection with the circuit board and the bottom plate. The coating may comprise spraying the conductive coating on the separated portion of the encapsulated slice. The method may optionally include a step of applying a non-conductive coating over the conductive coating.

In some versions, the stacking may comprise disposing a plurality of circuit boards within the inner cavity between the top plate and the bottom plate across a plane substantially parallel to the top plate and the bottom plate. The introducing the encapsulant in the inner cavity may dispose the encapsulant between the top plate and each of the plurality of circuit boards, between the bottom plate and each of the plurality of circuit boards, and between the outer stack frame and each of the plurality of circuit boards to form an encapsulated slice comprising each of the plurality of circuit boards. The separating may expose a previously unexposed portion of the top plate, a previously encapsulated portion of the circuit board, and a previously unexposed portion of the bottom plate from each of the plurality of circuit boards to form a plurality of separated portions of the encapsulated slice. The coating may comprise independently coating each of the separated portions of the encapsulated slice with a continuous conductive coating to surround the top plate, the circuit board, the encapsulant, and at least a portion of the bottom plate in each of the separated portions of the encapsulated slice to result in the conductive coating in each of the separated portions being in electrical connection with the circuit board and the bottom plate of the respective separated portions.

In some versions, the stacking may comprise stacking a plurality of molding stacks in register with each other to form a multi-layered molding stack, each molding stack comprising a mold frame comprising an outer stack frame and an inner cavity disposed between a top plate and a bottom plate, a circuit board disposed within the inner cavity between the top plate and the bottom plate, and an electrical lead in electrical connection with the circuit board extending from the circuit board through the bottom plate. The stacking may optionally comprise disposing a stiffener plate between each molding stack in the multi-layered molding stack and at both ends of the multi-layered molding stack. The introducing may comprise introducing the encapsulant in the inner cavity of each molding stack to dispose the encapsulant between the top plate and the circuit board, between the bottom plate and the circuit board, and between the outer stack frame and the circuit board in each molding stack to form a plurality of encapsulated slices within the molding stack. Between the introducing and the separating, the encapsulated slices may be unstacked from the molding stack. The separating may comprise exposing a previously unexposed portion of the top plate, a previously encapsulated portion of the circuit board, and a previously unexposed portion of the bottom plate from the circuit board in each encapsulated slice to form a plurality of separated portions. The coating may comprise independently coating each of the separated portions of the encapsulated slice with a continuous conductive coating to surround the top plate, the circuit board, the encapsulant, and at least a portion of the bottom plate in each of the separated portions of the encapsulated slice to result in the conductive coating in each of the separated portions being in electrical connection with the circuit board and the bottom plate of the respective separated portions.

The modules and methods of the present invention have several advantages. The modules do not require separate housing to contain the encapsulant and, unlike modules that use such housing, are not susceptible to high pressure liquid or aqueous cleaning sprays. The circuit board is capable of extending to the edge of the finished module, which allows electrical components to be mounted close to the module edge and also allows for a minimum overall size and higher component density as compared to other conventional modules. Electrical leads connecting to the circuit board, such as input/output pins (I/O pins), can protrude from the bottom surface and do not occupy additional horizontal area outside the footprint of the module as in other conventional modules. Conductors and other electrical components on the circuit board can connect directly to the EMI shield coating. This allows components on the circuit board such as common mode capacitors to connect directly to the shield. The invention provides for EMI shielding over the entire surface the modules, e.g., a six-sided EMI shield for six-sided modules.

The objects and advantages of the invention will appear more fully from the following detailed description of the preferred embodiment of the invention made in conjunction with the accompanying drawings.

DETAILED DESCRIPTION OF THE INVENTION

Figure 1:
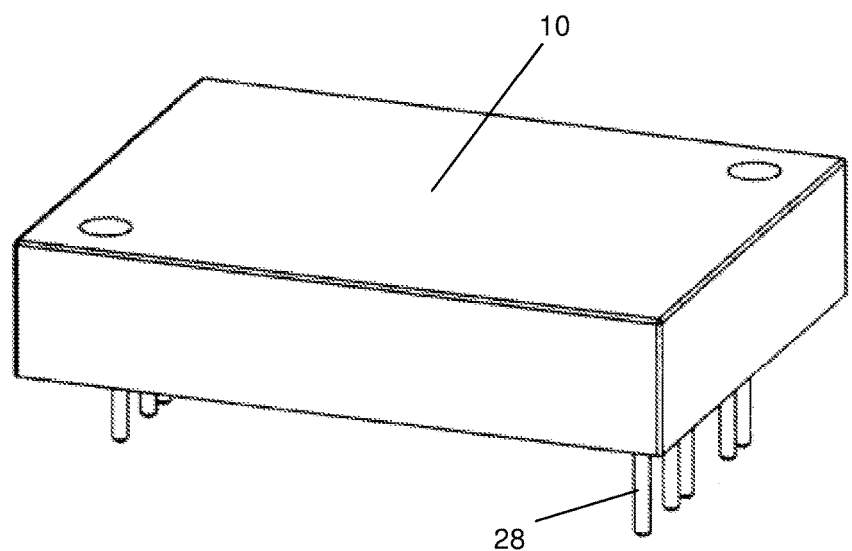
FIG. 1 shows a perspective view of an electronic module of the present invention.

The invention is directed at least on part to an electronic module 10 as shown in FIG. 1. The electronic module 10 comprises a printed circuit board sub-assembly 20 at least partially encapsulated therein and one or more electrical leads 28 extending therefrom.

Figure 2:
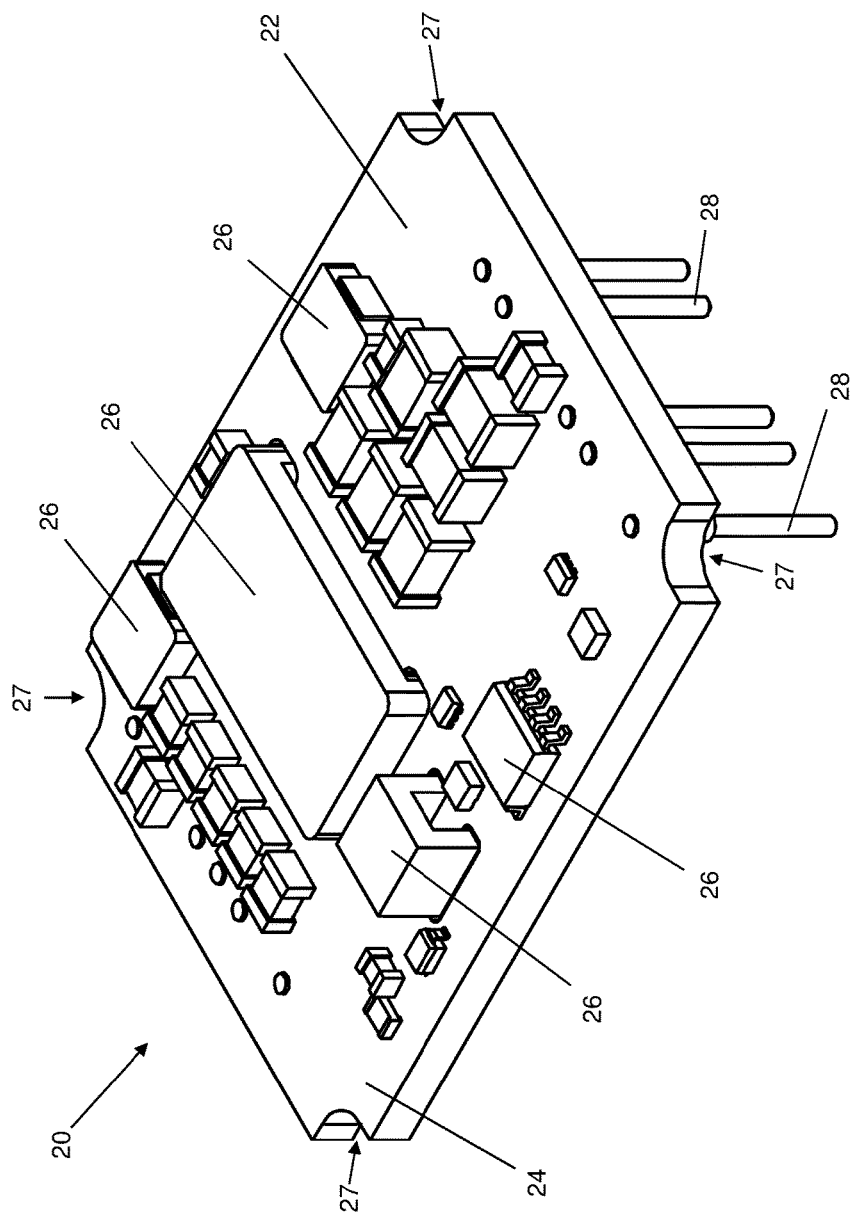
FIG. 2 shows a perspective view of a printed circuit board sub-assembly of the present invention.

An exemplary printed circuit board sub-assembly 20 is shown in FIG. 2. The printed circuit board sub-assembly 20 comprises a circuit board 22 and one or more electrical leads 28 in electrical connection with the circuit board 22 and extending therefrom.

The electrical leads 28 may take the form of input/output (I/O) connections, such as I/O pins.

The circuit board 22 comprises a substrate 24 and a number of electronic components 26 mechanically supported on or in the substrate 24. The electronic components 26 may include resistors, transistors, capacitors, inductors, diodes, or other electronic components known in the art. The electronic components 26 may be electronically connected to each other by interconnects printed or etched on a surface of the substrate 24 or integrated within the substrate 24. The interconnects may include conductive tracks, traces, pads, and/or other features and preferably comprise copper or other conductors. The interconnects may provide windings for planar magnetic components.

The substrate 24 may comprise a single insulating (non-conductive) planar layer with interconnects on only one side, a single insulating layer with interconnects on both sides, or a multi-layered substrate with multiple insulating layers and conductor layers, with the conductor layers functioning as interconnects. A preferred multi-layered substrate may comprise about 2-12 or more conductor layers, such as about 8-12 or more conductor layers, interspersed with insulating layers. The conductor layers may be electrically connected to each other with plated through-holes, commonly referred to as vias. The insulating layer or layers may comprise a glass-reinforced epoxy laminate. A preferred insulating layer is FR-4 glass epoxy, which is a composite material composed of woven fiberglass cloth with an epoxy resin binder that is flame resistant. A preferred conductor layer is copper foil, which may be etched to form various interconnects in the form of tracks, traces, pads, etc.

Figure 3:
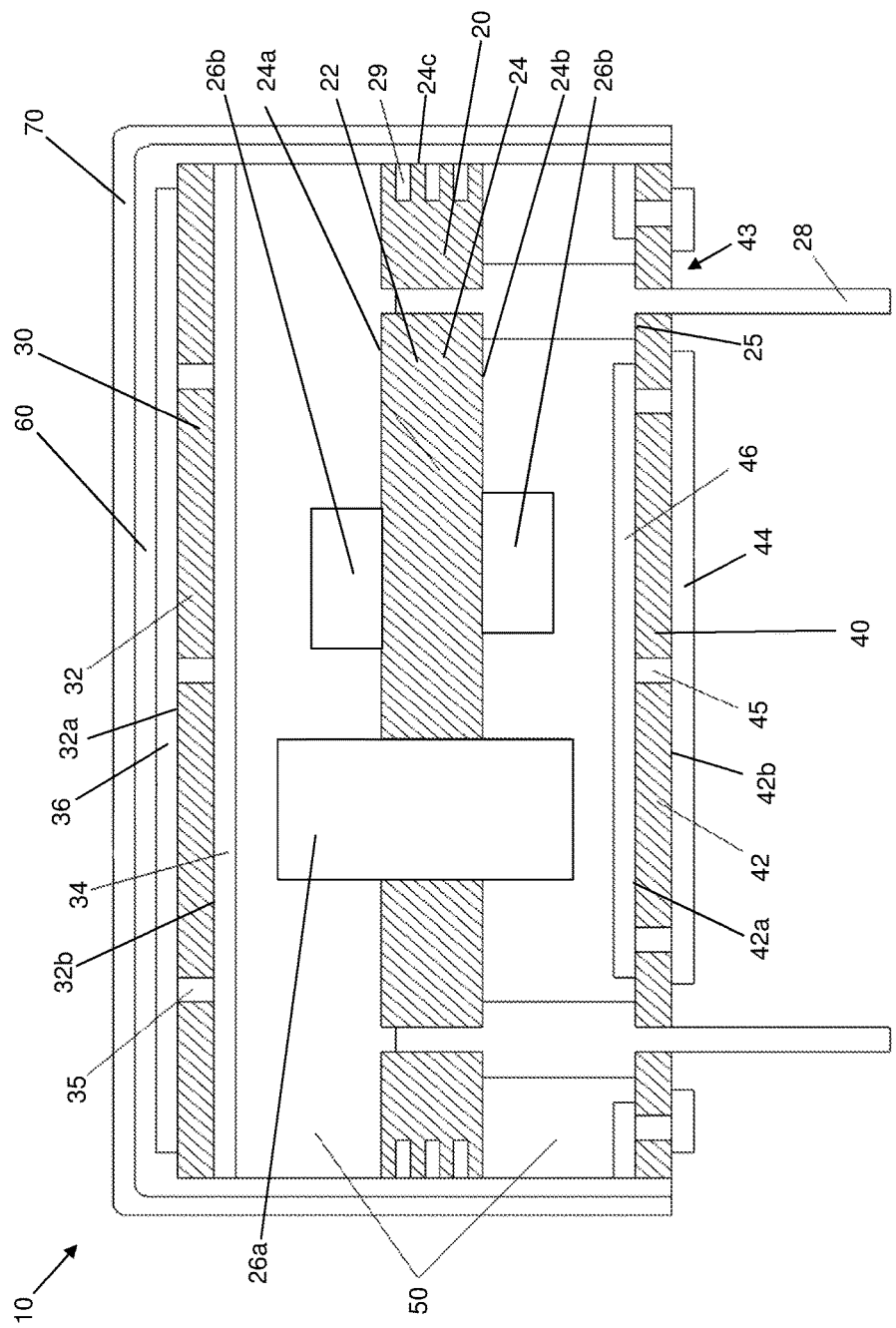
FIG. 3 shows an elevated cross-sectional view of an electronic module of the present invention.
Figure 4:
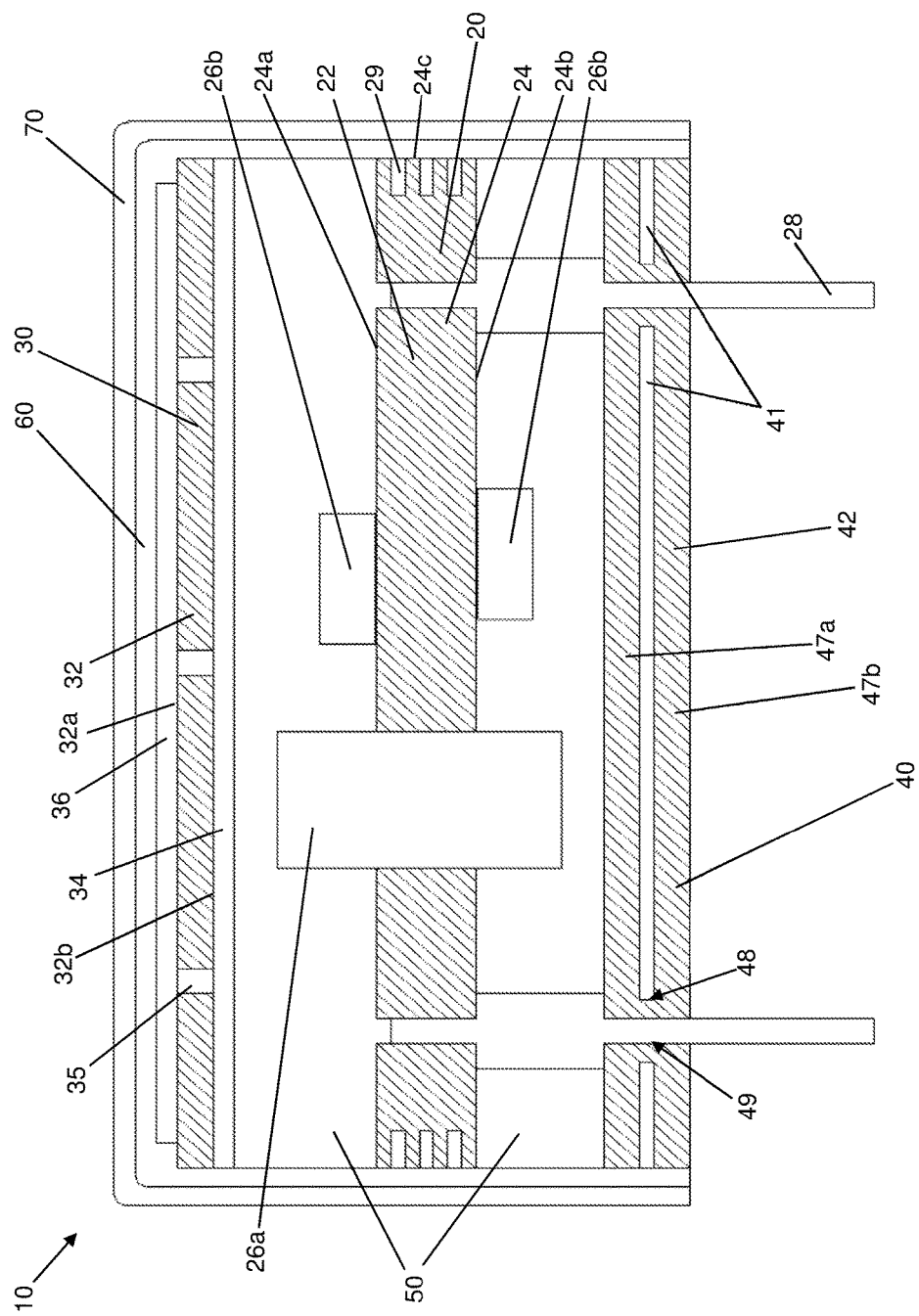
FIG. 4 shows an elevated cross-sectional view of another electronic module of the present invention.

The printed circuit board sub-assembly 20 is encompassed within an electronic module 10 as shown in FIGS. 3 and 4. The electronic module includes a top plate 30; a bottom plate 40; the printed circuit board sub-assembly 20 with the circuit board 22 disposed between the top plate 30 and the bottom plate 40; an encapsulant 50 disposed between the top plate 30 and the circuit board 22 and between the bottom plate 40 and the circuit board 22; a continuous conductive coating 60 surrounding the top plate 30, the circuit board 22, the encapsulant 50, and at least a portion of the bottom plate 40, and a non-conductive protective coating 70 surrounding the conductive coating 60.

The substrate 24 of the circuit board 22 is disposed on a plane substantially parallel to the top plate 30 and the bottom plate 40 in a stacked configuration. A top surface 24a of the substrate 24 faces the top plate 30, and a bottom surface 24b of the substrate 24 faces the bottom plate 40. The electronic components 26 on the circuit board 22 may comprise through-hole components 26a and surface-mount components 26b. The through-hole components 26a are embedded within the substrate 24, span the substrate 24, and extend above the top surface 24a of the substrate and below the bottom surface 24b of the substrate 24. Examples of through-hole components 26a include magnetic cores. Surface-mount components 26b may be mounted on the top surface 24a of the substrate 24 or the bottom surface 24b of the substrate 24.

The substrate 24 of the circuit board 22 comprises conductive edge traces 29 disposed around the edge 24c of the substrate 24 that electrically connect the circuit board 22 with the conductive coating 60. The conductive edge traces 29 may comprise terminal portions of one or more conductor layers or interconnects in the various layers of the substrate 24 and are exposed during the separation step during manufacturing as described below. The conductive edge traces 29 may comprise the terminal portions of interior layers of the substrate 24 only, outer layers (e.g., top and bottom layers) of the substrate 24 only, or both interior layers and outer layers of the substrate 24. The conductive edge traces 29 may be patterned in a finger pattern or other types of patterns, depending on the patterning of the conductive layer at the point at which the separation occurs.

Encapsulant 50 in some cases may not bond well with metal such as copper. Therefore, a substantial portion of each of the top surface 24a of the substrate 24 and the bottom surface 24b of the substrate 24 preferably comprises exposed non-metallic material, such as glass-epoxy composite. This can be accomplished by confining the conductor layers or interconnects of the substrate 24 within interior layers or configuring any conductor layers or interconnects on the top surface 24a or bottom surface 24b of the substrate in trace, grid, or finger patterns. In various versions, at least about 1%, about 5%, about 10%, about 15%, about 20%, about 25%, about 30%, about 35%, about 40%, about 45%, about 50%, about 55%, about 60%, about 65%, about 70%, about 75%, about 80%, about 85%, about 90%, about 95%, about 99%, or more of each of the top surface 24a of the substrate 24 and/or the bottom surface 24b of the substrate 24 comprises exposed non-metallic material, such as glass-epoxy composite.

The bottom plate 40 comprises a non-conductive portion and a conductive portion. The non-conductive portion is comprised of a non-conductive plate 42, such as a glass-epoxy composite, that preferably spans the entire length and width of the bottom plate 40. The non-conductive plate 42 functions as a structural "frame" for the conductive portion.

As shown in FIG. 3, the conductive portion of the bottom plate 40 may be comprised of a lower conductive portion 44 and an upper conductive portion 46. The lower conductive portion 44 may comprise a conductive plate, such as a solid metal plate, spanning at least a portion of a bottom surface 42b of the non-conductive plate 42. In preferred versions, the lower conductive portion 44 spans at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 95%, at least about 97% or more of the bottom surface 42b of the non-conductive plate 42. The lower conductive portion 44 may have openings 43 for the electrical leads 28. The lower conductive portion 44 may electrically connect to one or more of the electrical leads 28, such as a "case" pin. The lower conductive portion 44 may or may not extend all the way to the edge of the bottom surface 42b of the non-conductive plate 42. In preferred versions, the lower conductive portion 44 does not extend all the way to the edge of the bottom surface 42b of the non-conductive plate 42. In this manner, the lower conductive portion 44 will not form a direct electrical connection with the conductive coating 60. The extended, planar configuration of the lower conductive portion 44 forms an EMI shield on the bottom portion of the electronic module 10. The lower conductive portion 44 can be covered with a solder mask or another non-conductive coating for protection from oxidation and to add a finished appearance to the electronic module 10.

The upper conductive portion 46 may take the form of a metalized pattern, such as a grid or finger pattern, disposed on an upper surface 42a of the non-conductive plate 42. The upper conductive portion 46 preferably leaves at least a portion of the upper surface 42a of the non-conductive plate 42 exposed to permit bonding of the encapsulant 50 directly to the non-conductive plate 42. In various versions, the upper conductive portion 46 covers less than about 99%, about 95%, about 90%, about 85%, about 80%, about 75%, about 70%, about 65%, about 60%, about 55%, about 50%, about 45%, about 40%, about 35%, about 30%, about 25%, about 20%, about 15%, about 10%, about 5%, about 2.5%, about 1%, or about 0.5% of the upper surface 42a of the non-conductive plate 42.

The upper conductive portion 46 preferably extends to the edge of the top surface 42a of the non-conductive plate 42. In this manner, the upper conductive portion 46 will form a direct electrical connection with the conductive coating 60. Conductive vias 45 disposed within the non-conductive plate 42 may form an electrical connection between the upper conductive portion 46 and the lower conductive portion 44. Thus, the lower conductive portion 44 is indirectly electrically connected to the conductive coating 60 by virtue of the vias 45 and the upper conductive portion 46 to thereby form the EMI shield on the bottom portion of the electronic module 10. The vias 45 have a higher thermal conductivity than the surrounding glass-epoxy composite material. The vias 45 thereby improve the thermal conductivity of the bottom plate 40. The vias 45 may be filled to further improve the thermal conductivity.

As shown in FIG. 4, the conductive portion of the bottom plate 40 may alternatively comprise a conductive layer 41, such as a solid conductive layer, disposed between an upper non-conductive portion 47a and a lower non-conductive portion 47b of the non-conductive plate 42. In this configuration, the conductive layer 41 is preferably embedded between the upper non-conductive portion 47a and the lower non-conductive portion 47b of the non-conductive plate 42. This configuration has the benefit of providing a single, solid conductive layer. The conductive layer 41 may comprise a conductive plate, such as a solid metal plate, spanning at least a portion of the non-conductive plate 42. In preferred versions, the conductive layer 41 spans at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 95%, at least about 97% or more of the non-conductive plate 42. The conductive layer 41 may have openings 48 for the upper non-conductive portion 47a to connect to the lower non-conductive portion 47b and thereby form lead openings 49 for at least some the electrical leads 28 to pass through the bottom plate 40 in an insulated manner. The conductive layer 41 may electrically connect to one or more of the electrical leads 28, such as a "case" pin.

The conductive layer 41 preferably extends, or has portions that extend, to the edge of the non-conductive plate 42. In this manner, the conductive layer 41 will form a direct electrical connection with the conductive coating 60. The conductive layer 41 forms an EMI shield on the bottom portion of the electronic module 10.

The top plate 30 preferably comprises a non-conductive plate 32, such as a glass-epoxy composite, that preferably spans the entire length and width of the top plate 30. The non-conductive plate 32 functions as a structural "frame" for the top plate 30.

The top plate 30 may optionally comprise a lower conductive portion 34, an upper conductive portion 36, and conductive vias 35 electrically connecting the lower conductive portion 34 with the upper conductive portion 36. The lower conductive portion 34, upper conductive portion 36, and conductive vias 35, however, are not required for EMI shielding, due to the conductive coating 60. If the lower conductive portion 34, upper conductive portion 36, and conductive vias 35 are included in the top plate 30, these elements may have the structural features described above for the upper conductive portion 46, the lower conductive portion 44, and the vias 45, respectively, of the bottom plate 40.

Accordingly, the upper conductive portion 36 may comprise a conductive plate, such as a solid metal plate, spanning at least a portion of a top surface 32a of the non-conductive plate 32. In various versions, the upper conductive portion 36 spans at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 95%, at least about 97% or more of the top surface 32a of the non-conductive plate 32. The upper conductive portion 36 may or may not extend all the way to the edge of the top surface 32a of the non-conductive plate 32. In preferred versions, the upper conductive portion 36 does not extend all the way to the edge of the top surface 32a of the non-conductive plate 32. In this manner, the upper conductive portion 36 will not form a direct electrical connection with the conductive coating 60.

The lower conductive portion 34 may take the form of a metalized pattern, such as a grid or finger pattern, disposed on a lower surface 32b of the non-conductive plate 32. The lower conductive portion 34 preferably leaves at least a portion of the lower surface 32b of the non-conductive plate 32 exposed to permit bonding of the encapsulant 50 directly to the non-conductive plate 32. In various versions, the lower conductive portion 34 covers less than about 99%, about 95%, about 90%, about 85%, about 80%, about 75%, about 70%, about 65%, about 60%, about 55%, about 50%, about 45%, about 40%, about 35%, about 30%, about 25%, about 20%, about 15%, about 10%, about 5%, about 2.5%, about 1%, or about 0.5% of the lower surface 32b of the non-conductive plate 32. The lower conductive portion 34 preferably extends to the edge of the bottom surface 32b of the non-conductive plate 32. In this manner, the lower conductive portion 34 will form a direct electrical connection with the conductive coating 60.

The conductive portion of the top plate 30 may comprise a conductive layer, such as a solid conductive layer, disposed between an upper non-conductive portion and a lower non-conductive portion of the non-conductive plate 32, with a configuration as described above with reference to FIG. 4 for the bottom plate 40.

The encapsulant 50 is a non-conductive filler disposed between the top plate 30 and the circuit board 22 and between the bottom plate 40 and the circuit board 22. The encapsulant 50 may comprise a solid, cured from form of a non-conductive curable liquid material, such as epoxy-based resins. Encapsulants for semiconductor applications, also known as potting compounds, are well-known in the art. Any of these are suitable for use as an encapsulant for the purposes described herein. An exemplary encapsulant is Henkel Loctite Stycast 2850FT two component epoxy (Henkel AG & Co., Dusseldorf, Germany).

The encapsulant 50 fills or substantially fills any gaps between the top plate 30 and the circuit board 22 and between the bottom plate 40 and the circuit board 22 and preferably forms a strong bond with the non-metallic surfaces of each of the top plate 30, the circuit board 22, and the bottom plate 40. Formation of a strong bond with the non-metallic surfaces helps to prevent delamination of the electronic module 10. Separate pieces of encapsulant 50 may be disposed between the top plate 30 and the circuit board 22 and between the bottom plate 40 and the circuit board 22. However, it is preferred that a single, solid piece of encapsulant 50 is disposed between the top plate 30 and the circuit board 22 and between the bottom plate 40 and the circuit board 22. This can be obtained by virtue of cutouts 27 on the edge or internally within the circuit board 22 (see FIG. 2). The cutouts 27 unite the space between the top plate 30 and the circuit board 22 and the space between the bottom plate 40 and the circuit board 22 to form a single, continuous space for liquid encapsulant to fill and subsequently cure as a single, solid piece. Forming the encapsulant 50 as a single, solid piece increases the strength of the electronic module 10 and further prevents cracking or delamination.

To reduce or distribute forces exerted on the electronic components 26 by the encapsulant 50 and protect against moisture, dust, and chemicals, a conformal coating (not shown) may be disposed between the electronic components 26 and the encapsulant 50. The conformal coating can improve electrical performance of the electronic module 10 at temperature extremes. An example of an acceptable buffer material includes DOW CORNING® 3-1965 Conformal Coating (Dow Corning Corporation, Midland, Mich.).

The conductive coating 60 is preferably formed from a conductive, curable resin, which forms a continuous coating across the top and around the side portions of the sandwiched top plate 30, encapsulant 50, circuit board 22, and the bottom plate 40. The conductive coating 60 preferably forms a direct contact with each of these components, such as along the top and side portions of the top plate 30, the side portions of the encapsulant 50, the side portions of the circuit board 22, and the side portions of the bottom plate 40. In so doing, the conductive coating 60 forms direct electrical contacts with the conductive portion of the bottom plate 40 via the edge of upper conductive portion 46, the circuit board 22 via the conductive edge traces 29, and the conductive portion of the top plate 30, if present, via the edge of the lower conductive portion 34. The conductive coating 60 preferably does not cover the bottom side of the bottom plate 40, leaving at least about 10%, 20%, 30%, 40%, 50%, 60%, 70%, 80%, 90%, 95%, 97%, 99%, or more of the bottom side of the bottom plate 40 uncovered by the conductive coating 60. The conductive coating 60 is preferably a cured form of a conductive curable material, such as a metal-filled epoxy or epoxy paint. An exemplary conductive coating 60 is a two-component, silver-plated-copper filled highly conductive epoxy paint, such as Parker Chomerics CHO-SHIELD® 610 (Parker Hannifin Corp, Woburn, Mass.)

The non-conductive protective coating 70 surrounds the conductive coating 60 to provide electrical insulation and to protect the conductive coating 60 from environmental conditions. A representative coating is MIL-PRF-22750F epoxy polyamide coating (The Sherwin-Williams Company, Cleveland, Ohio), or Trans-Chem #37038 (Trans-Chem Coatings, Los Angeles, Calif.).

An electronic module 10 having the structure described above constitutes an encapsulated circuit assembly with EMI shielding on all sides. This EMI shielding is provided by the conductive coating 60 as well as the conductive portion of the bottom plate 40, which are in electrical connection as described above.

Figure 5:
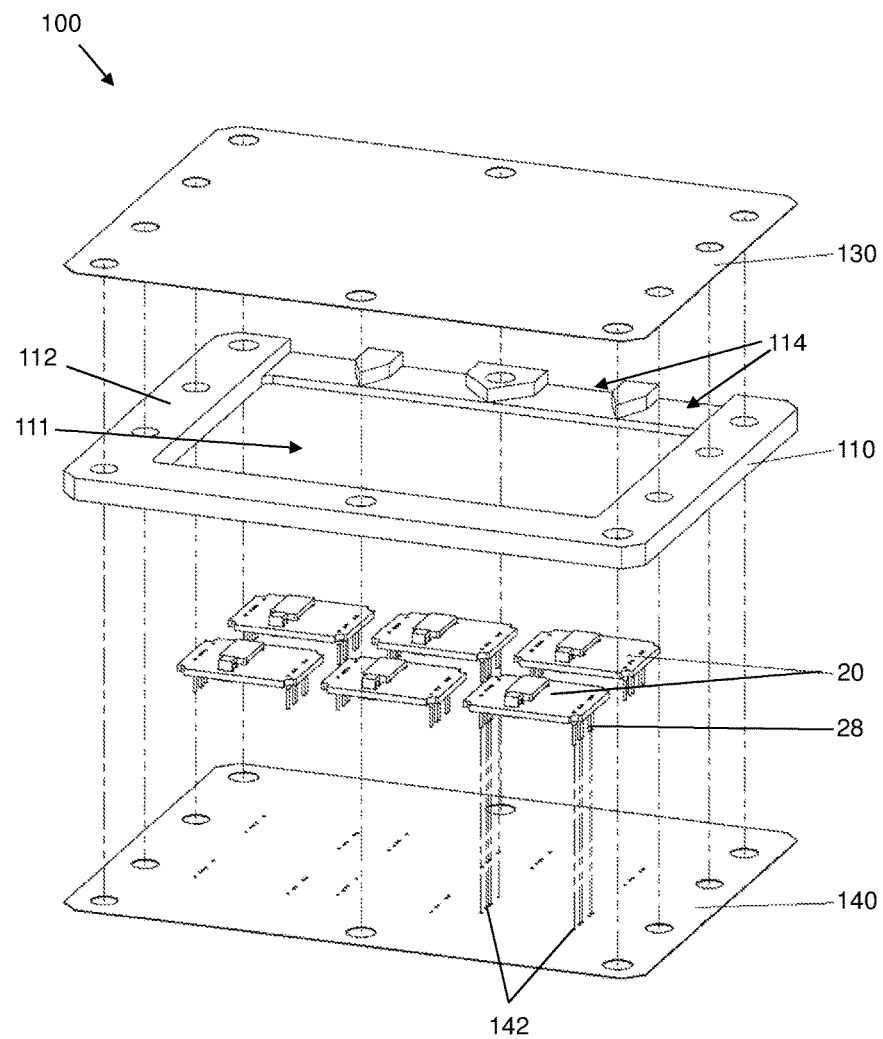
FIG. 5 shows an exploded perspective view of a molding stack of the present invention.

An electronic module 10 can be made by forming a molding stack 100 as shown in FIG. 5. The molding stack 100 includes a mold frame 110, one or more printed circuit board sub-assemblies 20, a top plate preform 130, and a bottom plate preform 140.

The mold frame 110 comprises an outer stack frame 112 that defines an inner cavity 111. The outer stack frame 112 includes gaps 114 for injection of encapsulant. The mold frame 110 may be made of a plastic laminate material, such as a phenolic, with similar properties to the encapsulant. An example of an appropriate material for the mold frame 110 is GAROLITE® sheet (McMaster-Carr, Elmhurst, Ill.).

The bottom plate preform 140 comprises groups of patterned openings 142 to accommodate passage of the electrical leads 28 of the printed circuit board subassemblies 20 therethrough. The bottom plate preform 140 may be pre-patterned with lower conductive portions 44 and upper conductive portions 46, as described for FIG. 3, in appropriate configurations with respect to the patterned openings 142 for the printed circuit board sub-assemblies 20 to be placed in register therewith. Alternatively or additionally, the bottom plate preform 140 may comprise a conductive layer 41 disposed between an upper non-conductive portion 47a and a lower non-conductive portion 47b, as described for FIG. 4.

The top plate preform 130 may also have pre-patterned lower conductive portions 34 and upper conductive portions 36, as described for FIG. 3, may have a conductive layer disposed between an upper non-conductive portion and a lower non-conductive portion, or may have only a non-conductive plate 32 without any conductive layer or conductive portions.

To form the molding stack 100, the printed circuit board sub-assemblies 20 are disposed within the inner cavity 111 of the mold frame 110, and the mold frame 110 is sandwiched between the top plate preform 130 and the bottom plate preform 140 in a manner the permits the electrical leads 28 of the printed circuit board subassemblies 20 to extend through the patterned openings 142. As shown in FIGS. 3 and 4, each electrical lead 28 comprises a ledge portion 25. The ledge portion 25 rests on the bottom plate preform 140 to suspend the circuit board 20 of the printed circuit board subassembly 20 above the bottom plate preform 140. The positioning of the ledge portions 25 in combination with the height of the outer stack frame 112 allows for a space to be defined between the circuit board 20 and both the bottom plate preform 140 and the top plate preform 130 for injection of encapsulant.

Figure 6:
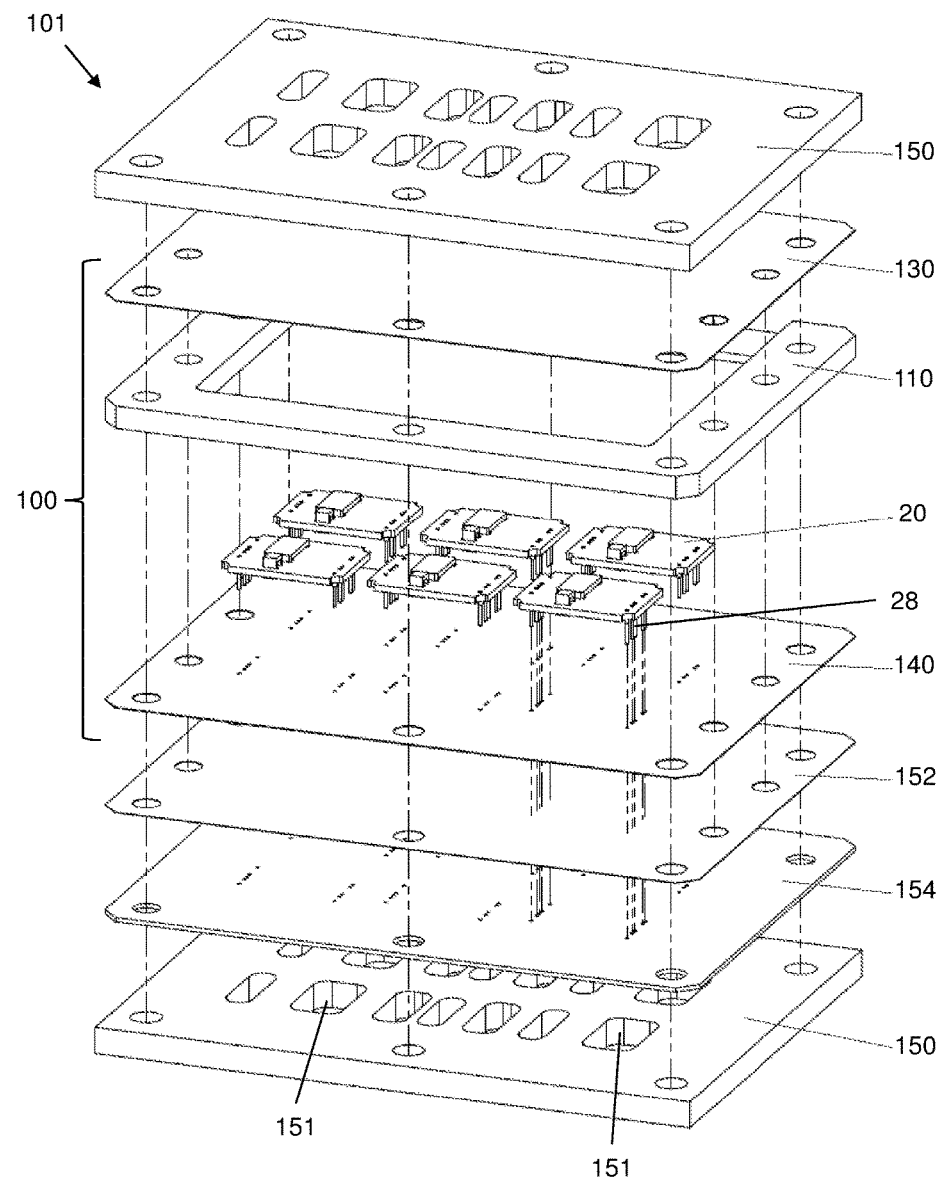
FIG. 6 shows an exploded perspective view of a manufacturing stack of the present invention.

As shown in FIG. 6, the molding 100 stack may be further sandwiched between stiffener plates 150 to form a manufacturing stack 101. The stiffener plates 150, which may be made from aluminum or other firm material, prevent warping during encapsulant curing and ensure that the finished electronic modules 10 are flat. Holes 151 in the stiffener plates 150 are positioned to accommodate the electrical leads 28 therein. A tape layer 152, such as a heat resistant polyimide film such as KAPTON® film (E. I. du Pont de Nemours and Company, Wilmington, Del.), and a pin guard 154, such as a glass-epoxy composite material, may be compressed between a lower stiffener plate 150 and the bottom plate preform 140 to seal any gaps around the electrical leads 28 and prevent liquid encapsulant from leaking prior to or during curing. The tape layer 152 does not have pre-formed holes for the electrical leads 28. Instead, the electrical leads 28 pierce the tape layer 152 when building the manufacturing stack 101. The pin guard 154 does have pre-formed holes for the electrical leads.

Figure 7:
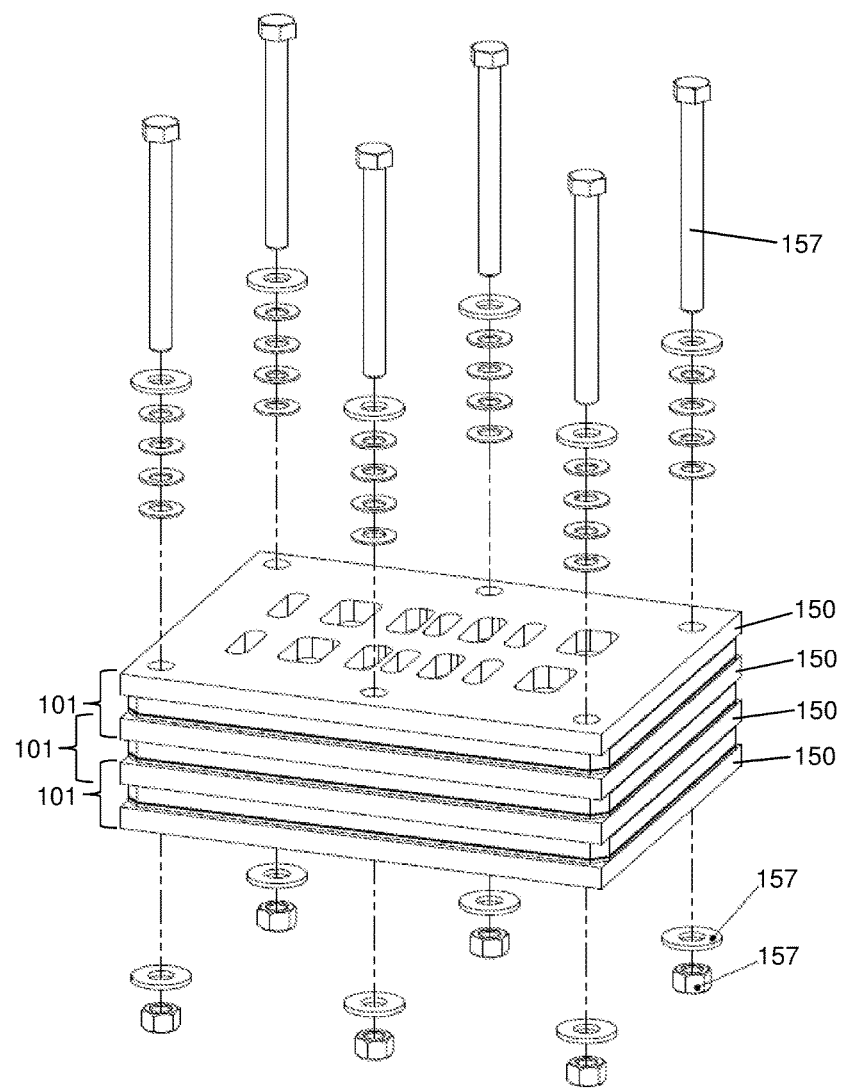
FIG. 7 shows a perspective view of a plurality of stacked manufacturing stacks of the present invention with fasteners shown in exploded view.

As shown in FIG. 7, multiple manufacturing stacks 101 can be stacked in register in increase the number of electronic modules 10 produced at a time. Each neighboring manufacturing stack 101 can share a single stiffener plate 150. The manufacturing stacks 101 can be compressed using fasteners 157.

After formation of at least the molding stack 100, and preferably a manufacturing stack 101 or a stack of manufacturing stacks 101, an encapsulant is injected through the gaps 114 and into the inner cavity 111 of the mold frame 110 in each molding stack 100, thereby filling the entire space between the top plate preform 130 and the bottom plate preform 140 and covering circuit boards 22 of the printed circuit board subassemblies 20 situated therein. The encapsulant is then permitted to cure.

Figure 8:
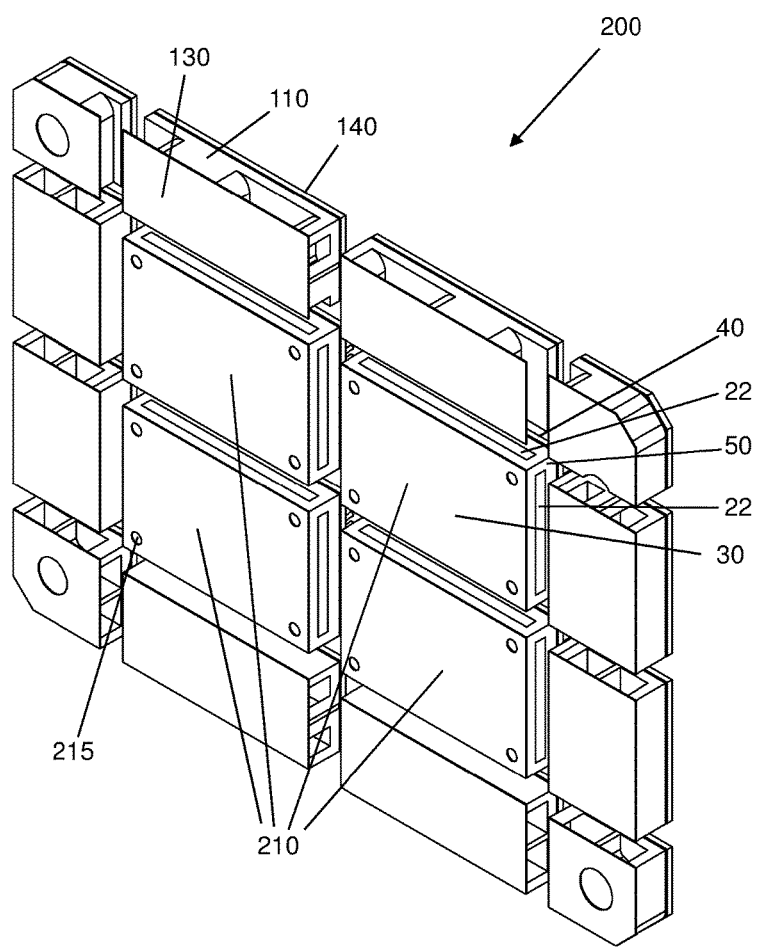
FIG. 8 shows an encapsulated slice of the present invention, which has been separated by sawing into individual pre-modules.

After curing, encapsulated slices 200, each comprising a top plate preform 130, a bottom plate preform 140, a mold frame 110, encapsulated circuit boards 22, and cured encapsulant 50 are separated from the manufacturing stacks 101. The encapsulated slices 200 are than separated into individual pre-modules 210, as shown in FIG. 8. Each pre-module 210 contains a top plate 30, encapsulant 50, a circuit board 22, and a bottom plate 40 that extend in substantially equal lengths and widths along three separate, substantially parallel planes. Mounting holes 215 are drilled in the pre-modules 210 at this time if desired. The slices 200 are preferably separated into individual pre-modules 210 by sawing or other separation techniques. The separation exposes conductive edge traces 29 on the circuit board 22, the upper conductive portion 46 at the edges of the bottom plate 40, and the lower conductive portion 34, if present, at the edges of the top plate 30.

After separating the encapsulated slices 200 into individual pre-modules 210, each individual pre-module 210 is then spray coated with the conductive coating 60 and then the non-conductive protective coating 70, thereby forming finished electronic modules 10.

Figure 9:
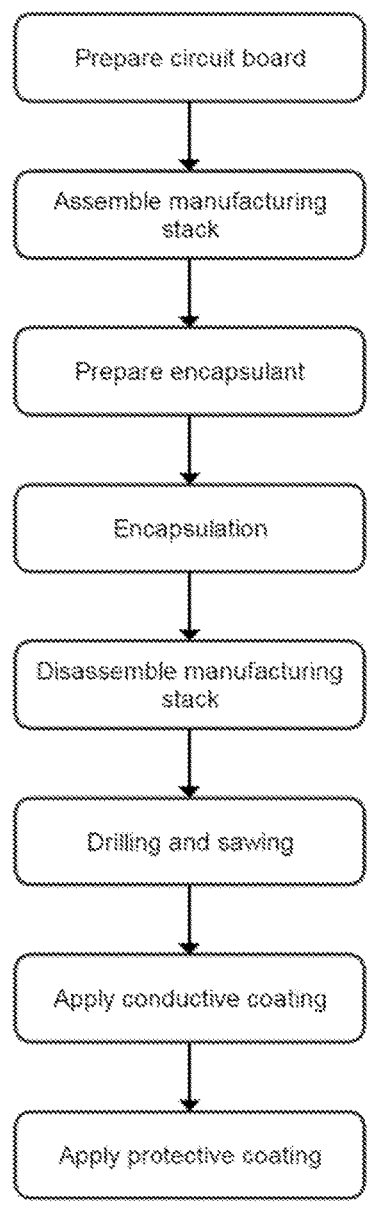
FIG. 9 shows a summary of a manufacturing process for producing the electronic modules of the present invention.

A summary of the manufacturing process described above is shown in FIG. 9.

The present invention is useful for encapsulation of many types of electronic assemblies or sensors which require both encapsulation and EMI shielding. These include: DC-DC power converters, EMI filters, transient protection modules, point-of-load converters, linear regulators, AC rectifiers, power factor correction modules, AC-DC converters, motor drives, gate driver modules, H-bridges, and laser diode drivers.

The present invention provides both protection from harsh environments and all-sided EMI shielding.

Any conductive element described herein may comprise copper or another conductive metal.

The elements and method steps described herein can be used in any combination whether explicitly described or not.

All combinations of method steps as used herein can be performed in any order, unless otherwise specified or clearly implied to the contrary by the context in which the referenced combination is made.

As used herein, the singular forms "a," "an," and "the" include plural referents unless the content clearly dictates otherwise.

Numerical ranges as used herein are intended to include every number and subset of numbers contained within that range, whether specifically disclosed or not. Further, these numerical ranges should be construed as providing support for a claim directed to any number or subset of numbers in that range. For example, a disclosure of from 1 to 10 should be construed as supporting a range of from 2 to 8, from 3 to 7, from 5 to 6, from 1 to 9, from 3.6 to 4.6, from 3.5 to 9.9, and so forth.

All patents, patent publications, and peer-reviewed publications (i.e., "references") cited herein are expressly incorporated by reference to the same extent as if each individual reference were specifically and individually indicated as being incorporated by reference. In case of conflict between the present disclosure and the incorporated references, the present disclosure controls.

It is understood that the invention is not confined to the particular construction and arrangement of parts herein illustrated and described, but embraces such modified forms thereof as come within the scope of the claims.

What is claimed is:

1. An electronic module comprising:
   a top plate;
   a conductive bottom plate;
   a circuit board disposed between the top plate and the bottom plate;
   an encapsulant disposed between the top plate and the circuit board and between the bottom plate and the circuit board;
   an electrical lead forming a direct electrical connection with the circuit board and extending from the circuit board through the encapsulant and further through the bottom plate; and
   a continuous conductive coating surrounding the top plate, the circuit board, the encapsulant, and at least a portion of the bottom plate, the conductive coating forming a direct electrical connection with the circuit board and a direct electrical connection with the bottom plate, wherein the direct electrical connection of the conductive coating with the circuit board is independent of the direct electrical connection of the conductive coating with the bottom plate and any direct electrical connection of the conductive coating with the electrical lead, and wherein the direct electrical connection of the conductive coating with the bottom plate is independent of the direct electrical connection of the conductive coating with the circuit board and any direct electrical connection of the conductive coating with the electrical lead.

2. The module of claim 1, wherein the conductive coating is in direct electrical connection with the circuit board via a conductive trace of the circuit board.

3. The module of claim 1, wherein the conductive coating is in direct electrical connection with the bottom plate via a metalized portion of the bottom plate.

4. The module of claim 1, wherein the encapsulant disposed between the top plate and the circuit board and between the bottom plate and the circuit board is a single, solid piece of encapsulant.

5. The module of claim 1, wherein:
the circuit board comprises a substrate comprising a top side and a bottom side;
the top side of the substrate is disposed between the bottom side of the circuit board and the top plate;
the bottom side of the circuit board is disposed between the top side of the circuit board and the bottom plate; and
the circuit board comprises at least one electrical component spanning the substrate from beyond the top side of the substrate to beyond the bottom side of the substrate.

6. The module of claim 1, wherein:
the circuit board comprises a substrate comprising a top side and a bottom side;
the top side of the substrate is disposed between the bottom side of the circuit board and the top plate;
the bottom side of the circuit board is disposed between the top side of the circuit board and the bottom plate; and
the circuit board comprises at least one electrical component on the top side of the substrate and at least one electrical component on the bottom side of the substrate.

7. The module of claim 1, wherein the bottom plate comprises a conductive portion and a non-conductive portion.

8. The module of claim 7, wherein the conductive portion of the bottom plate is in electrical connection with the conductive coating.

9. The module of claim 7, wherein the conductive portion comprises metal disposed on a top side of the non-conductive portion and metal disposed on a bottom side of the nonconductive portion, wherein the top side of the non-conductive portion is disposed between the bottom side of the non-conductive portion and the circuit board.

10. The module of claim 9, wherein the conductive portion comprises a conductive via spanning from the metal disposed on the top side of the non-conductive portion and the metal disposed on the bottom side of the non-conductive portion.

* * * * *